United States Patent [19]
van de Plassche

[11] Patent Number: 4,616,190
[45] Date of Patent: Oct. 7, 1986

[54] DIFFERENTIAL AMPLIFIER WITH CURRENT STEERING TO ENHANCE SLEW RATE

[75] Inventor: Rudy J. van de Plassche, Cupertino, Calif.

[73] Assignee: Signetics Corporation, Sunnyvale, Calif.

[21] Appl. No.: 771,748

[22] Filed: Sep. 3, 1985

[51] Int. Cl.⁴ ............................................. H03F 3/45
[52] U.S. Cl. .................................... 330/261; 330/147; 330/295
[58] Field of Search ................. 330/147, 149, 51, 252, 330/261, 295

[56] References Cited

U.S. PATENT DOCUMENTS

| 3,452,289 | 6/1969 | Ryan | 330/254 |
| 3,668,538 | 6/1972 | Hearn | 330/9 |
| 4,002,993 | 1/1977 | van de Plassche | 330/69 X |
| 4,075,575 | 2/1978 | Robe | 330/261 X |

OTHER PUBLICATIONS

Gray et al, *Analysis and Design of Analog Integrated Circuits*, (John Wiley & Sons: 1977), pp. 158–162, 217–221, 541–549.

Seevinck et al, "Universal Adaptive Biasing Principle for Micropower Applications", *Dig. Tech. Paps., European Solid-State Circs. Conf.*, Sep. 1984, pp. 59–62.

"µA4136 Quad Operational Amplifiers," 1982 *Linear Division Products*, Data Book, Fairchild Cam. and Instr. Corp., p. 4-174.

*Primary Examiner*—James B. Mullins
*Attorney, Agent, or Firm*—R. J. Meetin; R. T. Mayer; J. Oisher

[57] ABSTRACT

A steering circuit (10) in a differential amplifier having a pair of differentially arranged input amplifiers (A1 and A2) steers current from a pair of current sources (11 and 12) in such a way as to enhance slew rate without increasing offset voltage. The steering circuit is formed with a pair of steering amplifiers (A3 and A4) arranged in a differential configuration through a pair of resistors (R3 and R4).

14 Claims, 8 Drawing Figures

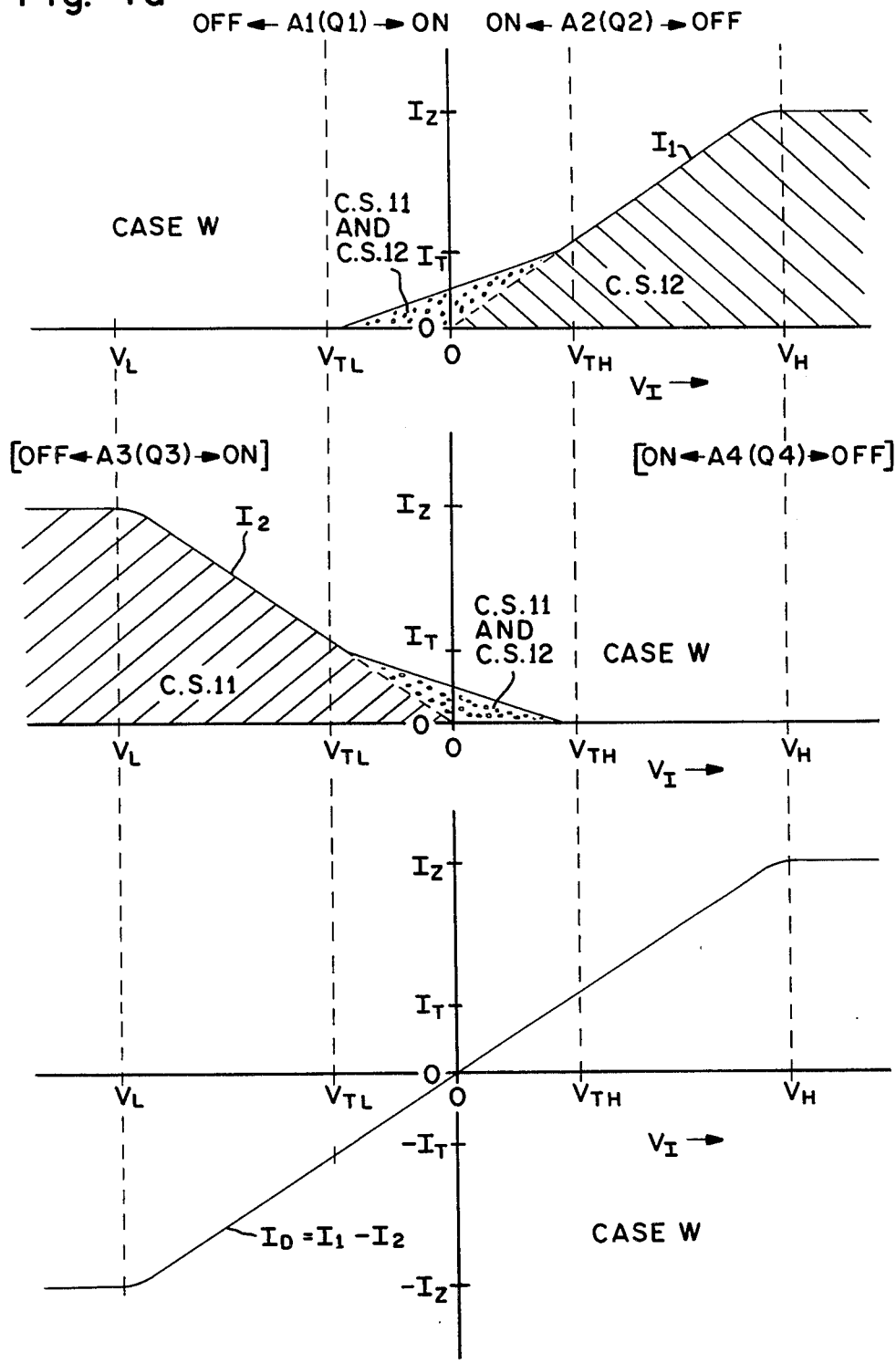

DIFFERENTIAL AMPLIFIER WITH CURRENT STEERING TO ENHANCE SLEW RATE

FIELD OF USE

This invention relates to differential amplifiers suitable for semiconductor integrated circuits.

BACKGROUND ART

The input stage for an operational amplifier ("op amp") is typically a differential amplifier. Turning to FIG. 1, it illustrates a model for an op amp in which a conventional differential input stage amplifies an input signal voltage $V_I$ to produce a pair of circuit currents $I_1$ and $I_2$ whose difference is representative of voltage $V_I$ (as long as $|V_I|$ is not too large). Input $V_I$ is supplied differentially to the bases of NPN input transistors Q1 and Q2 whose emitters are coupled together through a control point CP. A constant current source 7 connected between point CP and a source for a low supply voltage $V_{LL}$ provides a supply current $I_T$ for transistors Q1 and Q2. Their collectors respectively provide currents $I_1$ and $I_2$ to a subtracting circuit 8 connected to a source of a high supply voltage $V_{HH}$. Circuit 8 generates a signal current $I_D$ substantially equal to $K(I_1-I_2)$, where K is a proportionally constant.

Understanding the operation of this differential amplifier is facilitated with the assistance of FIG. 2 which shows how current $I_D$ varies with voltage $V_I$ (for the case where $K=1$). When input $V_I$ is zero, current $I_D$ is also zero since $I_1=I_2=I_T/2$. If $V_I$ is increased, $I_1$ increases towards $I_T$ as transistor Q1 becomes progressively more conductive. $I_2$ simultaneously decreases as transistor Q2 becomes progressively less conductive. It turns off when $V_I$ reaches about 80 millivolts. A further increase in $V_I$ does not cause any further amplifier changes. The reverse occurs when $V_I$ is reduced. Transistor Q1 becomes progressively less conductive and turns substantially off when $V_I$ reaches about $-80$ millivolts.

Current $I_D$ from the differential amplifier is usually provided to a stage that capacitively integrates current $I_D$ to produce an output voltage $V_O$. The integrating stage is shown in FIG. 1 as a capacitor CO connected across a high-gain inverting amplifier 9. Capacitor CO provides frequency compensation for the two stages to make the combination stable for unity-gain feedback. The value $C_O$ of capacitor CO is approximately $g_m/2\pi f_O$, where $g_m$ is the transconductance of the differential stage, and $f_O$ is the frequency at which the forward gain of the two stages falls to unity.

The slew rate S is the maximum rate at which voltage $V_O$ changes in response to a large step in voltage $V_I$. For FIG. 1, the $V_O$ rate of change is limited by the rate at which current $I_D$ charges capacitor CO. Since the maximum value of $I_D$ is $I_T$, S is approximately $I_T/CO$. The slew rate can then be expressed as $$S \approx 2\pi f_O I_T / g_m \qquad (1)$$

Unity-gain frequency $f_O$ is typically about 1 megahertz. S is then about 0.3 volt/microsecond. This is often too low.

One way to increase the slew rate at a given value of $f_O$ is to reduce the transconductance by using emitter degeneration resistors $R_{E1}$ and $R_{E2}$ shown in dashed lines at the respective emitters of transistors Q1 and Q2 in FIG. 1. The transconductance falls approximately to $g_m/(1+g_mR_E)$, where $R_E$ is the nominal value of resistor $R_{E1}$ or $R_{E2}$. The slew rate is increased by $g_mR_E$ for which 10 is a representative value. Unfortunately, resistor/transistor mis-matching causes the input offset voltage to increase. It typically degrades by around the same factor that the slew rate improves. This is not acceptable.

W. Hearn describes another technique for improving slew rate in U.S. Pat. No. 3,668,538 in which the small-signal transconductance approximately equals $g_m$ for FIG. 1. The maximum current for charging Hearn's compensating capacitor is increased greatly by providing alternate current paths that become operative when the input voltage is large. Hearn can achieve a slew rate of 30–40 volts/microsecond when $f_O$ is about 1 megahertz. However, resistors along the alternate paths must have high values to achieve this slew rate. The normal resistor mis-matching increases the offset voltage and noise. In addition, the use of lateral transistors of opposite polarity to the input transistors significantly worsens the high-frequency behavior of Hearn's device.

In U.S. Pat. No. 4,002,993, the present inventor discloses a slew-rate enhancement technique in which part of the current from an emitter current source is diverted away from the input transistors when the input voltage is small. A sensing circuit causes the fraction of diverted current to decrease when the input voltage becomes large so as to increase the current available to the input transistors. This increases the slew rate. Although offset voltage is not a problem, the common-mode rejection ratio is limited because the sensing circuit is sensitive to component variations.

DISCLOSURE OF THE INVENTION

In accordance with the invention, current from a pair of current sources in a differential amplifier is steered in such a manner as to enhance slew rate without increasing input offset voltage. The differential amplifier normally uses like-polarity transistors to avoid degrading the frequency response and to reduce sensitivity to component variations. The present circuit thereby achieves high slew rate without the disadvantages of the prior art circuits described above.

The invention employs various amplifying components that have at least three electrodes. These components are referred to as three-electrode amplifiers. Each has a first flow electrode, a second flow electrode, and a control electrode for regulating current transmission between the flow electrodes.

The differential amplifier of the invention employs a pair of like-configured three-electrode input amplifiers for amplifying an input voltage differentially supplied to their control electrodes to produce a pair of circuit currents representative of the input voltage. The circuit currents are respectively supplied from the second electrodes of the two input amplifiers whose first electrodes are coupled together through a control point. A signal current substantially proportional to the difference between the circuit currents is provided from the differential amplifier and capacitively integrated to produce an output voltage.

The input amplifiers are referred to as the first and second amplifiers. Both are conductive when the input voltage is in a range extending from a low voltage $V_{TL}$ less than zero to a high voltage $V_{TH}$ greater than zero. The first amplifier turns substantially off when the input voltage drops below $V_{TL}$. The second turns substantially off when the input voltage rises above $V_{TH}$.

A current supply provides the control point with current for the input amplifiers. The current supply contains a steering circuit, a first current source for providing a first supply current, and a second current source for providing a second supply current.

The steering circuit progressively steers more of the second supply current through the first amplifier when the input voltage rises above $V_{TH}$ to a higher voltage $V_H$. This occurs while the second amplifier is turned off. The absolute value of the circuit current at the second electrode of the first amplifier thereby progressively increases as the input voltage goes from $V_{TH}$ to $V_H$ so as to cause the absolute value of the signal current to increase in the same way. The steering circuit likewise progressively steers more of the first supply current through the second amplifier when the input voltage drops below $V_{TL}$ to a lower voltage $V_L$. This causes the absolute value of the signal current to progressively increase as the input voltage goes from $V_{TL}$ to $V_L$. The increased amount of signal current available when the input voltage is at $V_L$ or $V_H$ enables the output voltage to slew faster.

The steering circuit preferably uses a pair of like-configured three-electrode steering amplifiers whose control electrodes are respectively coupled to those of the input amplifiers. The first electrode of one of the steering amplifiers is coupled to one of the current sources and through a resistor to the control point. The first electrode of the other steering amplifier is similarly coupled to the other current source and through another resistor to the control point.

The four amplifiers desirably comprise four like-polarity bipolar transistors. Suitable adjustment of the physical characteristics of the various transistors and resistors enables the signal current to vary in qualitatively different ways as a function of the input voltage. This allows the differential amplifier to be optimized for particular applications.

BRIEF DESCRIPTION OF THE DRAWINGS

FIGS. 4a and 4b are graphs for current variation as a function of input voltage for the differential amplifiers of FIGS. 3, 5, and 6.

Like reference symbols are employed in the drawings and the description of the preferred embodiments to represent the same or very similar item or items.

DESCRIPTION OF THE PREFERRED EMBODIMENTS

Figure 3:
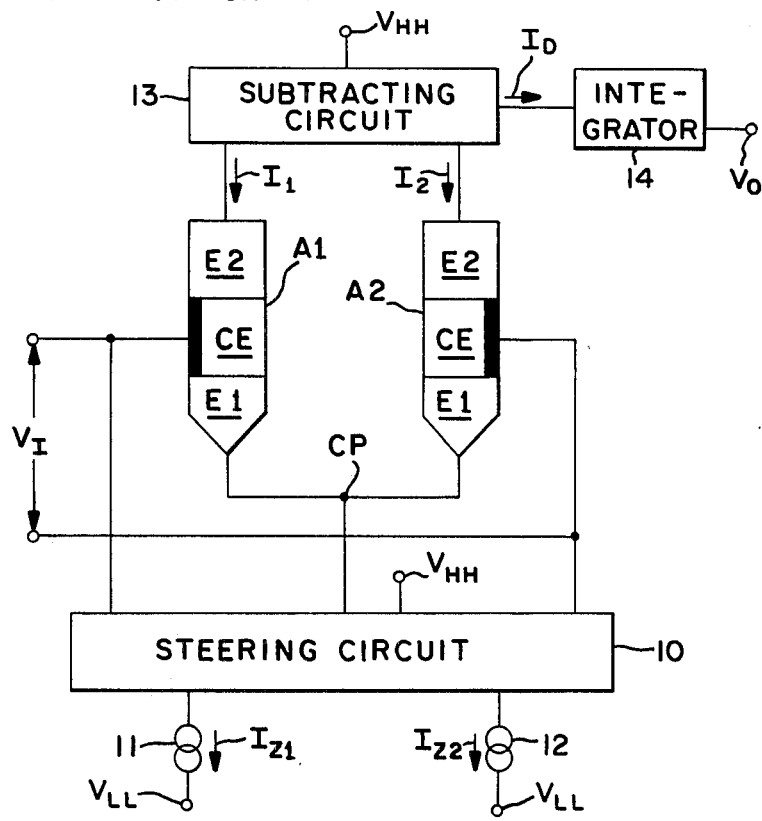
FIG. 3 is a block diagram for a differential amplifier and associated integrating element in accordance with the invention.
Figure 5:
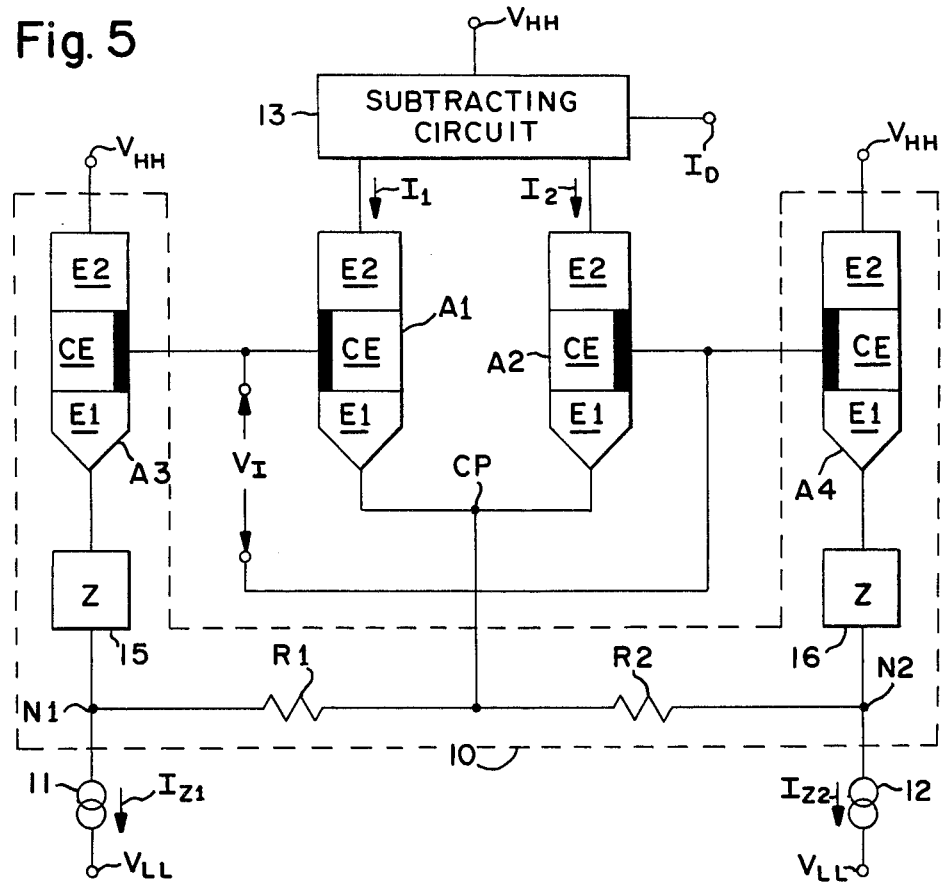
FIGS. 5 and 6 are circuit diagrams for more particular embodiments of the differential amplifier of FIG. 3.

With reference to FIGS. 3 and 5 discussed further below, the invention uses various like-configured three-electrode amplifiers. Each has a first flow electrode (E1), a second flow electrode (E2), and a control electrode (CE) for controlling current flow between the flow electrodes (E1 and E2). The current (if any) flowing in the control electrode is normally much smaller than that otherwise moving between the flow electrodes. This allows the control electrode current to be neglected in comparison to the flow electrode current.

A three-electrode amplifier might be a single transistor. In the case of a bipolar transistor, its emitter, collector, and base are respectively the first, second, and control electrodes. These are the source, drain, and gate for a field-effect transistor (FET) of either the insulated-gate or junction type.

A three-electrode amplifier could, however, consist of more than just a single transistor. One example is a bipolar Darlington circuit in which the emitter of an input transistor drives the base of a trailing transistor. In this example, the control electrode is (connected to) the base of the input transistor, while the first and second flow electrodes are (connected to) the emitter and collector of the trailing transistor.

As used in describing certain three-electrode amplifiers, "like-configured" means that they have corresponding elements interconnected in the same way and that each set of corresponding elements is of the same semiconductor polarity. For example, a pair of three-electrode amplifiers would generally be "like-configured" if both are NPN transistors (even though the emitter areas are different) but not if they are complementary transistors. Likewise, a pair of Darlington circuits are "like-configured" as long as the input transistors are of the same polarity and the trailing transistors are of the same polarity (even if different from that of the input transistors).

FIG. 3 illustrates a differential amplifier that uses current steering to achieve a high slew rate. This differential amplifier, which can be used as an op amp input stage, has a pair of largely identical like-configured three-electrode input amplifiers A1 and A2. Input voltage $V_I$ is differentially supplied to their control electrodes. Their first electrodes are connected together through control point CP. Circuit currents $I_1$ and $I_2$ whose difference is representative of input $V_I$ (as long as $|V_I|$ is not too large) are respectively supplied from the second electrodes of amplifiers A1 and A2.

A current supply consisting of a steering circuit 10 and constant current sources 11 and 12 provides supply current at point CP for amplifiers A1 and A2. Steering circuit 10, which is connected to the $V_{HH}$ supply, controls the current available at point CP in response to input $V_I$. Current sources 11 and 12 are connected between circuit 10 and the $V_{LL}$ supply to provide respective supply currents $I_{Z1}$ and $I_{Z2}$.

The differential amplifier also contains a subtracting circuit 13 connected to the $V_{HH}$ supply. Circuit 13 provides signal current $I_D$ which substantially equals $K(I_1-I_2)$.

An integrator 14 capacitively integrates current $I_D$ to produce voltage $V_O$. Circuit 14 could, for example, consist of a capacitor connected across a high-gain inverting amplifier as in FIG. 1. Alternatively, integrator 14 might simply be the parasitic capacitance of the line carrying current $I_D$. Integrator 14 might also be a capacitor connected between the $I_D$ line and $V_{LL}$ supply. In any case, the combination of integrater 14 and the differential amplifier meets the requirement that the capacitance equal $gm/2\pi f_O$.

Figure 4B:
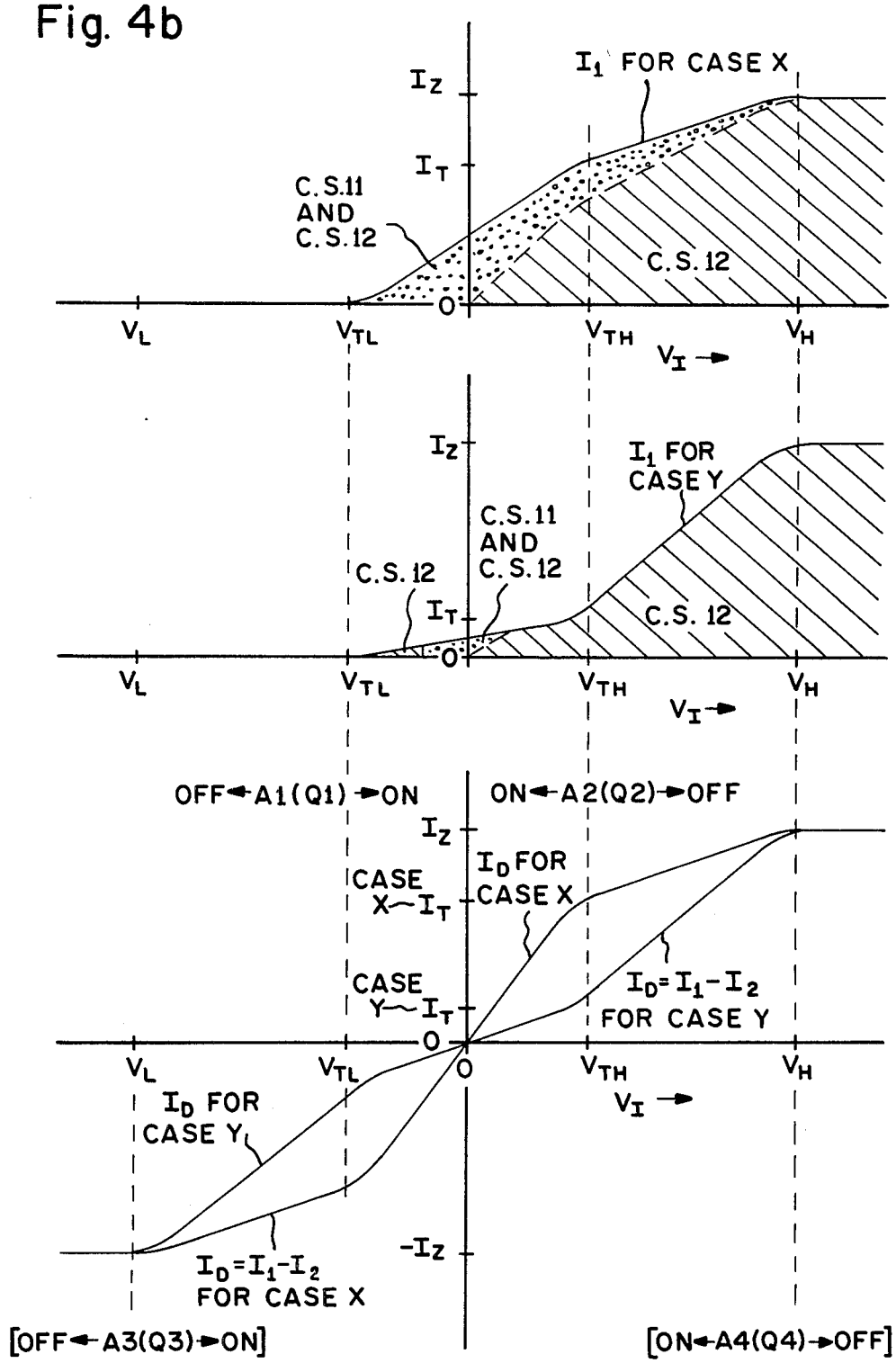

FIGS. 4a and 4b are helpful in understanding the current steering in the differential amplifier of FIG. 3. Assuming that K is 1, $I_D=I_1-I_2$. FIG. 4a shows how currents $I_1$, $I_2$, and $I_D$ vary as a function of voltage $V_I$ for generally optimum case W. FIG. 4b shows how $I_1$ and $I_D$ vary with $V_I$ for two other cases X and Y. The dashed areas under the $I_1$ curves indicate the portions of current $I_1$ that definitely come from current source (C.S.) 12. The dashed areas under the $I_2$ curve indicate the portion of current $I_2$ that definitely comes from current source (C.S.) 11. The dotted areas under the $I_1$ and $I_2$ curves indicate current that comes jointly from current sources 11 and 12 but cannot be definitely designated as coming specifically from source 11 or from source 12. $I_Z$ is the magnitude of $I_{Z1}$ or $I_{Z2}$.

The operation of the differential amplifier falls into several qualitatively distinct ranges. Voltage $V_I$ is in the "small-signal" range when $V_I$ is between $V_{TL}$ and $V_{TH}$. Since $|V_{TL}|$ approximately equals $V_{TH}$ which is typically about 80 millivolts, the differential amplifier is in the small-signal condition when $|V_I|$ is less than $V_{TH}$. The "large-signal" range means that $|V_i|$ is greater than $V_{TH}$. Noting that $|V_L|$ approximately equals $V_H$, the large-signal range is divided into a lower subrange in which $V_{TH} < |V_I| < V_H$ and a higher subrange in which $|V_I| > V_H$.

Amplifiers A1 and A2 are both conductive when $V_I$ is in the small-signal range. Amplifier A1 turns substantially off when $V_I$ drops below $V_{TL}$. Amplifier A2 similarly turns substantially off when $V_I$ rises above $V_{TH}$.

Circuit 10 does perform current steering when $|V_I|$ is small as indicated in FIGS. 4a and 4b. However, the sum of currents $I_1$ and $I_2$ is approximately constant at a level denoted as $I_T$. Although $|I_D|$ is slightly greater than $I_T$ when $|V_I|$ equals $V_{TH}$, the net result for the small-signal condition is not materially different from that of FIG. 1 in which there is no emitter degeneration.

A big difference occurs when input $V_I$ enters the large-signal range. As $V_I$ rises above $V_{TH}$, circuit 10 progressively steers more of supply current $I_{Z2}$ through amplifier A1. As indicated by the dotted area between $V_{TH}$ and $V_H$ for case X in FIG. 4b, some current jointly provided from current sources 11 and 12 may also flow through amplifier A1. If so, the jointly provided current progressively decreases as $V_I$ approaches $V_H$. Current $I_1$ attains a maximum equal to $I_Z$ when $V_I$ reaches $V_H$. A further increase in $V_I$ does not produce any changes in the differential amplifier. Circuit 10 simply steers all of current $I_{Z2}$ through amplifier A1. Circuit 10 also "absorbs" supply current $I_{Z1}$, none of it flowing through amplifier A1 or through amplifier A2 which is turned off. More particularly, current $I_{Z1}$ is diverted to the $V_{HH}$ supply.

The opposite occurs when $V_I$ drops below $V_{TL}$. Circuit 10 progressively steers more of current $I_{Z1}$ through amplifier A2 until $V_I$ reaches $V_L$. No further changes occur if $V_I$ drops further. Circuit 10 "absorbs" current $I_{Z2}$, none of it flowing through amplifier A2.

The maximum value of $I_D$ is thus $I_Z$. Assuming that circuit 10 does not cause the large-signal transconductance of the differential amplifier to differ significantly from its small-signal transconductance $g_m$, the slew rate S for the circuit in FIG. 3 is:

$$S \approx 2\pi f_O I_Z / g_m \qquad (2)$$

Figure 1:
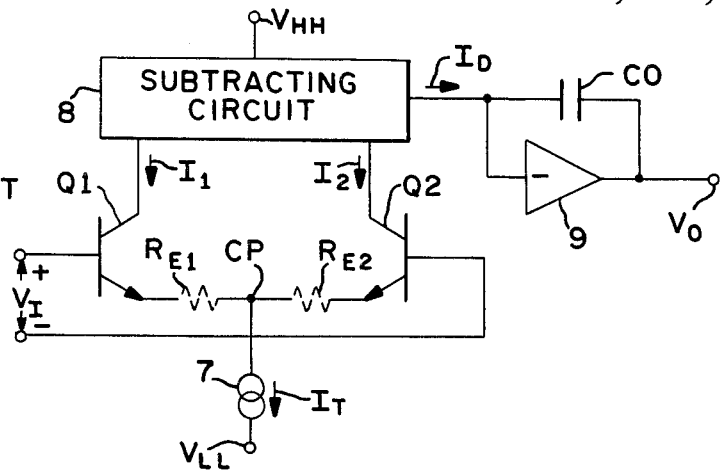
FIG. 1 is a circuit diagram of a prior art op amp having a differential input stage.
Figure 2:
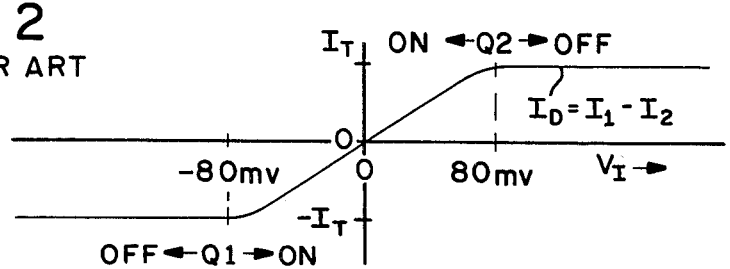
FIG. 2 is a graph of signal current as a function of input voltage for the differential input stage of FIG. 1.

If $f_O$ and $g_m$ for FIG. 3 are the same as in FIG. 1, the slew rate for the present circuit is enhanced approximately by the factor $I_Z/I_T$. This factor may easily be 10 or more. The upper limit for $I_Z/I_T$ is determined by the maximum current allowable in the circuit.

FIG. 5 shows a general implementation for steering cicuit 10 in the present differential amplifier. The principal components of circuit 10 are a pair of largely identical like-configured three-electrode steering amplifiers A3 and A4 and a pair of equal-value resistors R1 and R2. The control electrodes of amplifiers A3 and A4 are respectively connected to the control electrodes of amplifiers A1 and A2 to receive input $V_I$. The second electrodes of amplifiers A3 and A4 are connected to the $V_{HH}$ supply. Their first electrodes are respectively coupled through nodes N1 and N2 to current sources 11 and 12. Resistors R1 and R2 are connected between point CP on one hand, and nodes N1 and N2 respectively, on the other hand.

An impedance 15 may be connected between node N1 and the A3 first electrode. A largely identical impedance 16 may be connected between node N2 and the A4 first electrode. If present impedances 15 and 16 usually are resistors.

With reference to FIGS. 4a and 4b, amplifiers A3 and A4 are both conductive when $V_I$ is between $V_L$ and $V_H$. When $V_I$ is zero, a large fraction of current $I_{Z1}$ flows through amplifier A3. A large fraction of current $I_{Z2}$ also flows through amplifier A4. If $V_I$ is increased, the portion of current $I_{Z1}$ flowing through amplifier A3 increases further and reaches $I_Z$ at or before the point that $V_I$ reaches $V_H$. At the same time, progressively less of current $I_{Z2}$ flows through amplifier A4, the rate of fall becoming greater when $V_I$ passes $V_{TH}$. Amplifier A4 turns substantially off as $V_I$ rises above $V_H$. The reverse occurs if $V_I$ is decreased. Progressively less of current $I_{Z1}$ flows through amplifier A3 which turns substantially off when $V_I$ falls below $V_L$. The portion of current $I_{Z2}$ flowing through amplifier A4 increases further and reaches $I_Z$ before or at the point that $V_I$ passes $V_L$.

Figure 6:
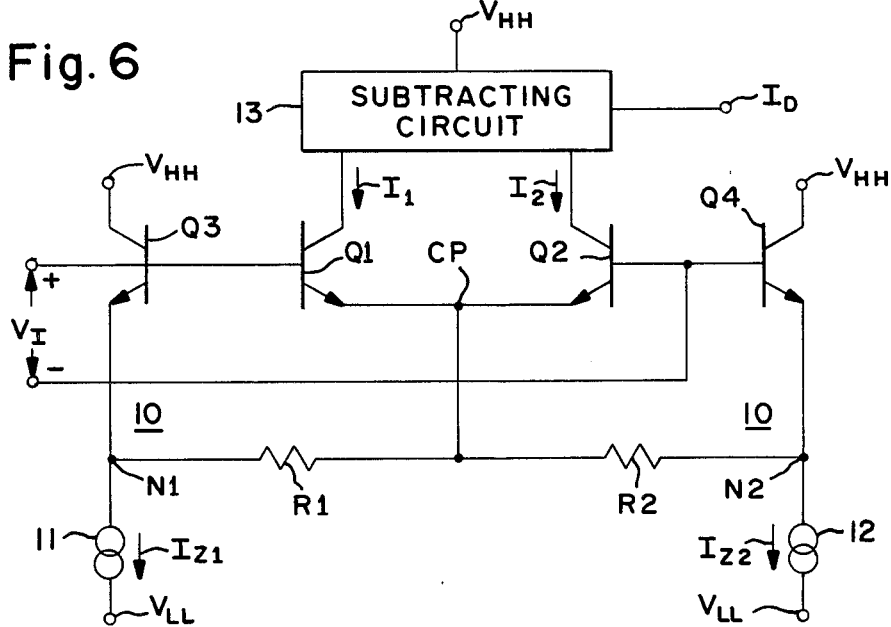

FIG. 6 depicts a bipolar embodiment of the differential amplifier of FIG. 5 in which amplifiers A1–A4 are respective NPN transistors Q1, Q2, Q3, and Q4. Using FIG. 6, a more fundamental explanation of the operation can be given. Circuit 10 does not significantly affect transistors Q1 and Q2 when $|V_I|$ is small. The current steering becomes important when $|V_I|$ becomes large. Assume that $V_I$ rises above $V_{TH}$ where $I_D$ is just slightly greater than $I_T$. Transistor Q2 is off. Transistor Q3 transmits all or nearly all of current $I_{Z1}$ so that the R1 current is quite small. The result is that transistor Q3, resistor R1, and current source 11 have little effect on signal current $I_D$.

Transistors Q1 and Q4, resistor R2, and current source 12 substantially control current $I_D$. These elements act like a differential amplifier whose transconductance is approximately $1/R$ where R is the resistance of resistor R2 (or R1). As $V_I$ continues to rise toward $V_H$, transistor Q4 becomes progressively less conductive. More of current $I_{Z2}$ is steered through transistor Q1. Eventually transistor Q4 turns off, forcing all of current $I_{Z2}$ to flow through transistor Q1. Current $I_D$ rises to $I_Z$ to enhance the slew rate.

In the small-signal range, $g_m$ is approximately $I_T/2V_T$ where $V_T$ is about 25 millivolts at room temperature. It is undesirable to have $g_m$ differ significantly from the large-signal transconductance because this creates difficulty in achieving high-frequency stability. Accordingly, the differential amplifier of FIG. 6 is optimized by setting $RI_T/2V_T$ approximately equal to one. $I_T$ can be determined from $I_Z$ for any particular set of parameter values.

The input offset voltage for the differential amplifier is determined by the matching of transistors Q1 and Q2 plus the matching of components in subtracting circuit 10. Transistors Q3 and Q4 do not have to be precisely matched since only one of them significantly affects the large-signal operation at any time. Likewise, only one of resistors R1 and R2 significantly affects the large-signal operation at any time so that they do not need to be precisely matched. Their matching only affects the linearity of the $I_D$ function when $|V_I| > V_{TH}$. Consequently, use of steering circuit 10 in FIG. 6 (and in FIG. 5) does not cause the offset voltage to increase to any substantial degree.

The particular cases achieved in FIGS. 4a and 4b depend on the size of transistors Q3 and Q4 to that of transistors Q1 and Q2. Let p be the ratio of the emitter area of transistor Q3 or Q4 to the emitter area of transistor Q1 or Q2. Case W was achieved for p=7. Reducing p below 7 (e.g., to 4) yielded case X. Increasing p above 7 (e.g., to 14) resulted in case Y. For these three cases, R was 250 ohms, and $I_Z$ was around 1 milliampere.

Figure 7:
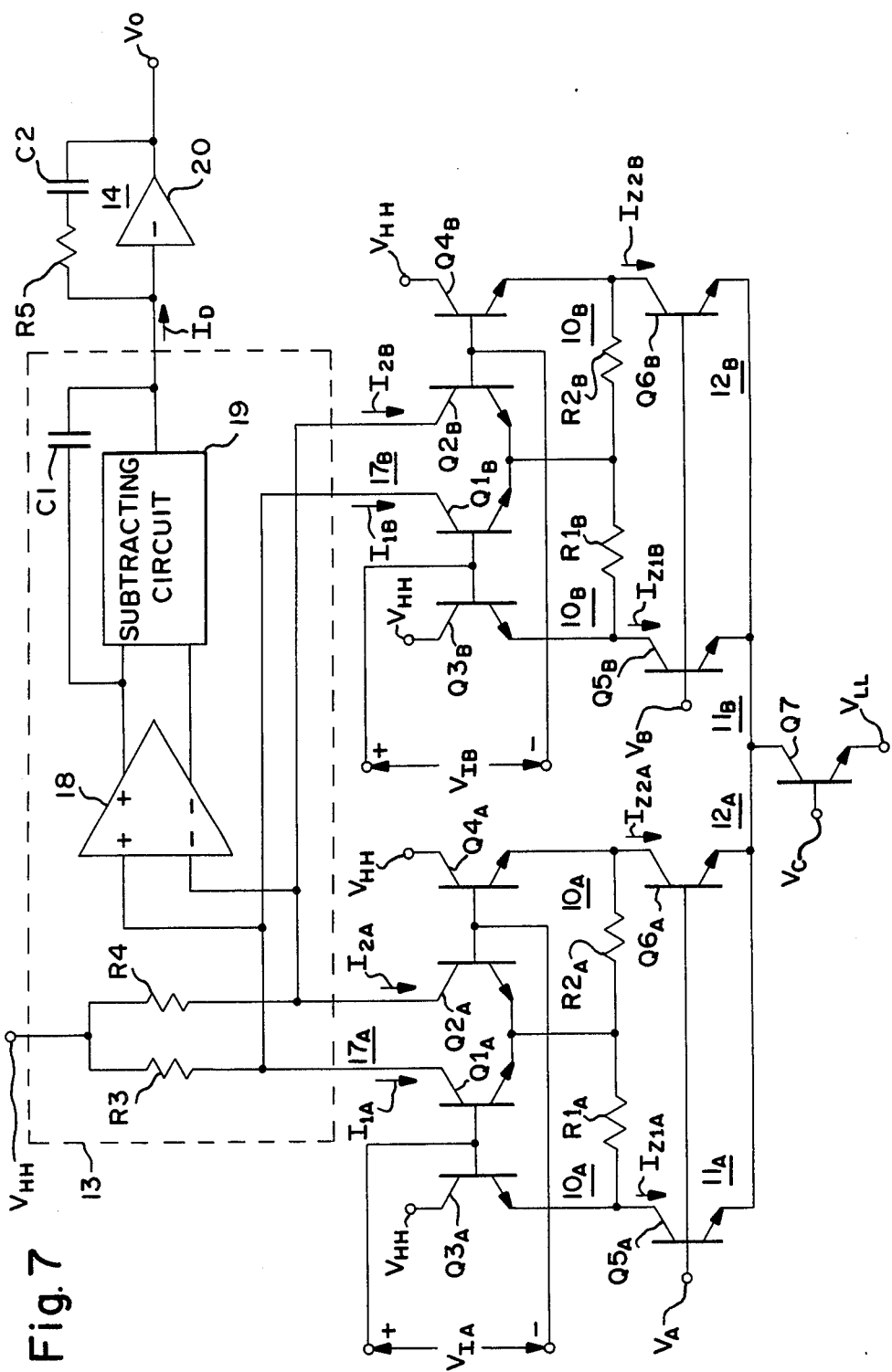
FIG. 7 is a circuit diagram of a preferred embodiment of part of an op amp using the differential amplifier of FIG. 6.

FIG. 7 depicts a preferred embodiment of the first two stages of an op amp in which the input stage consists of a pair of differential amplifiers $17_A$ and $17_B$ of the type shown in FIG. 6. The subscripts "A" and "B" have been added to the reference symbols employed for the differential amplifier of FIG. 6 to indicate the corresponding elements for differential amplifiers $17_A$ and $17_B$ in FIG. 7.

Input voltages $V_{IA}$ and $V_{IB}$ are respectively supplied to differential amplifiers $17_A$ and $17_B$. However, subtracting circuit 13 processes the circuit currents from only one of them at any given time. This is accomplished by suitably switching the current sources connected to steering circuits $10_A$ and $10_B$. As shown in FIG. 7, current sources $11_A$ and $12_A$ respectively consist of NPN transistors $Q5_A$ and $Q6_A$ whose bases receive a voltage $V_A$ and whose emitters are coupled through an NPN transistor Q7 to the $V_{LL}$ supply. Current sources $11_B$ and $12_B$ respectively consist of NPN transistors $Q5_B$ and $Q6_B$ whose bases receive a voltage $V_B$ and whose emitters are also coupled through transistor Q7 to the $V_{LL}$ supply. Voltages $V_A$ and $V_B$ are complementary. If voltage $V_A$ is high so that voltage $V_B$ is low, differential amplifier $17_A$ is selected whereas differential amplifier $17_B$ is turned off. Circuit 13 then processes currents $I_{1A}$ and $I_{2A}$. The reverse occurs when voltage $V_B$ is high.

Circuit 13 consists of equal-value resistors R3 and R4, a differential input/differential output amplifier 18, a subtracting sub-circuit 19, and a capacitor C1 arranged as shown in FIG. 7. Resistors R3 and R4 act as current sources. Capacitor C1 is a feed-forward frequency-compensation element. Use of amplifier 18 enables proportionality constant K for current $I_D$ to exceed one. Integrator 14 consists of a high-gain inverting amplifier 20 across which a capacitor C2 and a resistor R5 are connected in series.

In FIG. 7, $V_{HH}$ and $V_{LL}$ preferably are 5 and −5 volts. Resistors $R1_A/R2_A/R1_B/R2_B$, R3/R4, and R5 respectively are 1,500, 2,000, and 44 ohms. $I_Z$ is about 1 milliampere. Capacitors C1 and C2 are both 2.5 picofarads.

Methods for manufacturing the various elements of the present invention are well known in the semiconductor art. The various amplifying circuits are preferably fabricated in monolithic integrated circuit form using PN-junction isolation to separate active regions in a semiconductor wafer.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results. Thus, various modifications, changes, and applications may be made by those skilled in the art without departing from the true scope and spirit of the invention as defined by the appended claims.

I claim:

1. A circuit for amplifying an input voltage $V_I$ to produce a pair of circuit currents whose difference is representative of $V_I$, the circuit having: supply means for providing current at a control point; and like-configured first and second input amplifiers, each having a first flow electrode, a second flow electrode, and a control electrode for regulating current transmission between the flow electrodes, $V_I$ being differentially supplied to the control electrodes, the first electrodes coupled together through the control point, the second electrodes respectively providing the circuit currents, the second amplifier turning substantially off when $V_I$ rises to a high voltage $V_{TH}$ greater than zero, and the first amplifier turning substantially off when $V_I$ drops to a low voltage $V_{TL}$ less than zero; characterized in that the supply means comprises:

first and second current sources for providing first and second supply currents; and steering means (1) for progressively steering more of the second supply current through the first amplifier as $V_I$ rises above $V_{TH}$ to a higher voltage $V_H$ and (2) for progressively steering more of the first supply current through the second amplifier as $V_I$ drops below $V_{TL}$ to a lower voltage $V_L$.

2. A circuit as in claim 1 further including:

means for generating a signal current substantially proportional to the difference between the circuit currents; and means for capacitively integrating the signal current to produce an output voltage.

3. A circuit as in claim 1 characterized in that the steering means (1) steers substantially all of the second supply current through the first amplifier when $V_I$ is greater than $V_H$ and (2) steers substantially all of the first supply current through the second amplifier when $V_I$ is less than $V_L$.

4. A circuit as in claim 1 characterized in that the steering means comprises:

first and second resistors; and like-configured third and fourth steering amplifiers, each having a first flow electrode, a second flow electrode, and a control electrode for regulating current transmission between the flow electrodes of that amplifier, the control electrodes of the third and fourth amplifiers respectively coupled to the control electrodes of the first and second amplifiers, the first electrode of the third amplifier coupled to the first current source and through the first resistor to the control point, and the first electrode of the fourth amplifier coupled to the second current source and through the second resistor to the control point.

5. A circuit as in claim 4 characterized in that:

the current sources are further coupled to a source of a first supply voltage; and the second electrodes of the steering amplifiers are coupled to a source of a second supply voltage.

6. A circuit as in claim 5 characterized in that (1) substantially all of the first supply current flows through the third amplifier when $V_I$ is greater than $V_H$ and (2) substantially all of the second supply current flows through the fourth amplifier when $V_I$ is less than $V_L$.

7. A circuit as in claim 6 characterized in that (1) progressively less of the second supply current flows through the fourth amplifier as $V_I$ increases from zero to $V_H$ and (2) progressively less of the first supply current flows through the third amplifier as $V_I$ decreases from zero to $V_L$.

8. A circuit as in claim 7 characterized in that (1) the fourth amplifier is substantially off when $V_I$ is greater than $V_H$ and (2) the third amplifier is substantially off when $V_I$ is less than $V_L$.

9. A circuit as in claim 5 characterized in that the first, second, third, and fourth amplifiers respectively comprise like-polarity first, second, third, and fourth bipolar transistors, each having an emitter, a collector, and a base respectively coupled to the first, second, and control electrodes of its amplifier.

10. A circuit as in claim 9 characterized in that the third and fourth transistors have greater emitter area than the first and second transistors.

11. A circuit as in claim 10 further including:
means for generating a signal current substantially proportional to the difference between the circuit currents; and
means for capacitively integrating the signal current to produce an output voltage.

12. A circuit for amplifying an input voltage $V_I$ to produce a pair of circuit currents whose difference is representative of $V_I$, there being: supply means for providing current at a control point; and like-configured first and second amplifiers, each having a first flow electrode, a second flow electode, and a control electrode for regulating current transmission between the flow electrodes, $V_I$ being differentially supplied to the control electrodes, the first electrodes coupled together through the control point, and the second electrodes respectively providing the circuit currents; characterized in that the supply means comprises:
first and second current sources for respectively providing first and second supply currents;
first and second resistors; and
like-configured third and fourth amplifiers, each having a first flow electrode, a second flow electrode, and a control electrode for regulating current transmission between the flow electrodes of that amplifier, the control electrodes of the third and fourth amplifiers respectively coupled to the control electrodes of the first and second amplifiers, the first electrode of the third amplifier coupled to the first current source and through the first resistor to the control point, and the first electrode of the fourth amplifier coupled to the second current source and through the second resistor to the control point.

13. A circuit as in claim 12 further including:
means for generating a signal current substantially proportional to the difference between the circuit currents; and
means for capacitively integrating the signal current to produce an output voltage.

14. An operational amplifier comprising:
a plurality of circuits, each operable for amplifying an input voltage $V_I$ to produce a pair of circuit currents whose difference is representative of $V_I$, each circuit comprising: supply means for providing current at a control point; and like-configured first and second amplifiers, each having a first flow electrode, a second flow electrode, and a control electrode for regulating current transmission between the flow electrodes, $V_I$ being differentially supplied to the control electrodes, the first electrodes coupled together through the control point, and the second electrodes respectively providing the circuit currents; characterized in that the supply means comprises:
first and second current sources for respectively providing first and second supply currents;
first and second resistors; and
like-configured third and fourth amplifiers, each having a first flow electrode, a second flow electrode, and a control electrode for regulating current transmission between the flow electrodes of that amplifier, the control electrodes of the third and fourth amplifiers respectively coupled to the control electrodes of the first and second amplifiers, the first electrode of the third amplifier coupled to the first current source and through the first resistor to the control point, and the first electrode of the fourth amplifier coupled to the second current source and through the second resistor to the control point;
switching means for turning off the current sources for all the circuits but a selected one;
means for generating a signal current substantially proportional to the difference between the circuit currents for each circuit when it is selected; and
means for capacitively integrating the signal current to produce an output voltage.

* * * * *